United States Patent
Kola et al.

Patent Number: 5,936,831
Date of Patent: Aug. 10, 1999

[54] THIN FILM TANTALUM OXIDE CAPACITORS AND RESULTING PRODUCT

[75] Inventors: Ratnaji Rao Kola; King Lien Tai, both of Berkeley Heights, N.J.

[73] Assignee: Lucent Technologies Inc., Murray Hill, N.J.

[21] Appl. No.: 08/814,051

[22] Filed: Mar. 6, 1997

[51] Int. Cl.$^6$ .............................. H01G 4/005; H01G 4/06
[52] U.S. Cl. .................... 361/303; 361/305; 361/311; 361/321.5
[58] Field of Search .................... 361/303–305, 361/311–313, 321.1, 321.2, 321.3, 321.4, 321.5; 257/303, 306, 310

[56] References Cited

U.S. PATENT DOCUMENTS 5,264,728  11/1993  Ikeda et al. ............................ 257/761
5,696,017  12/1997  Ueno .................................... 437/60

*Primary Examiner*—Kristine Kincaid
*Assistant Examiner*—Anthony Dinkins
*Attorney, Agent, or Firm*—Mathews, Collins, Shepherd & Gould, P.A.

[57] ABSTRACT

In accordance with the invention, a thin film capacitor including a dielectric of nitrogen or silicon-doped tantalum oxide and at least one electrode including chromium. Preferably the capacitor is fabricated by anodically oxidizing $TaN_x$ or $Ta_2Si$ and forming a Cr counterelectrode. The method is fully compatible with MCM processing. It produces anodic $Ta_2O_5$ capacitors having exceptionally low leakage currents (<1 nA/cm$^2$ at 10 V), high breakdown fields (>4 MV/cm) and high capacitance densities (70 nF/cm$^2$). The devices are stable at 350° C. with excellent capacitor properties and are particularly useful as thin film capacitors of large area (>1 mm$^2$).

8 Claims, 2 Drawing Sheets

THIN FILM TANTALUM OXIDE CAPACITORS AND RESULTING PRODUCT

FIELD OF THE INVENTION

This invention relates to methods for making thin film capacitors and, in particular, to methods for making thin-film capacitors using tantalum oxide dielectric films.

BACKGROUND OF THE INVENTION

Thin film capacitors are becoming increasingly important components in high frequency hybrid microelectronics and in advanced packaging arrangements such as multichip modules (MCMs). They are used in distributed RC networks and as decoupling capacitors to protect active devices from switching transients.

Thin film capacitors for advanced packaging applications advantageously exhibit a high capacitance density, low leakage current and a high breakdown voltage, all in large area thin films. In addition the capacitors should be compatible with subsequent steps in MCM processing. For example, the capacitors should possess sufficient thermal stability to undergo the thermal cycling up to 350° C. used to cure polyimide layers in MCMs. The capacitors should be made from materials compatible with materials commonly used in MCMs.

Because of its excellent dielectric properties, $Ta_2O_5$ has been extensively investigated as a dielectric for thin film capacitors, but these efforts have failed to find a method or structure that is optimal for advanced packaging. Efforts to make capacitors using $Ta_2O_5$ films deposited by reactive sputtering, chemical vapor deposition (CVD), and plasma enhanced chemical vapor deposition have produced devices having high leakage currents and low breakdown voltages. See T Aoyama et al., "Leakage current mechanism of amorphous and polycrystalline $Ta_2O_5$ films grown by chemical vapor deposition", *J. Electrochem. Soc.*, Vol. 143, No. 3, pp. 977–983 (March 1996).

Capacitors fabricated with anodized reactively sputtered $Ta_2O_5$ films were found to have superior leakage and breakdown properties. Unfortunately the films degraded upon thermal annealing above 200° C., with irreversible increases in the temperature coefficient of capacitance (TCC) and the dissipation factor. See J. M. Schoen et al, "The correlation between temperature coefficient of capacitance and dielectric loss in tantalum and tantalum-aluminum anodic oxides," *J. Electrochem. Soc.*, Vol. 119, pp. 1215–1217 (September 1972). This degradation is believed to be due to the diffusion of electrode metal atoms into the dielectric and diffusion of oxygen out, creating oxygen deficiency defects.

A variety of electrode metals have been tried to overcome this degradation problem, but thus far only tungsten was found to provide thermal stability. Chromium was tried but specifically rejected. See M. Peters et al., "Thermally stable thin film tantalum pentoxide capacitor", *Proc. of the International Conference on Multichip Modules*, Denver, pp. 94–99 (April 1996). Unfortunately tungsten is a refractory metal not fully compatible with conventional MCM fabrication techniques. Accordingly there is a need for a new method for making tantalum oxide thin film capacitors.

SUMMARY OF THE INVENTION

In accordance with the invention, a thin film capacitor comprises a dielectric of nitrogen or silicon-doped tantalum oxide and at least one electrode comprising chromium. Preferably the capacitor is fabricated by anodically oxidizing $TaN_x$ or $Ta_2Si$ and forming a Cr counterelectrode. The method is fully compatible with MCM processing. It produces anodic $Ta_2O_5$ capacitors having exceptionally low leakage currents (<1 nA/cm² at 10 V), high breakdown fields (>4 MV/cm) and high capacitance densities (70 nF/cm²). The devices are stable at 350° C. with excellent capacitor properties and are particularly useful as thin film capacitors of large area (>1 mm²).

BRIEF DESCRIPTION OF THE DRAWINGS

The advantages, nature and various additional features of the invention will appear more fully upon consideration of the illustrative embodiments now to be described in detail. In the drawings.

It is to be understood that these drawings are for purposes of illustrating the concepts of the invention and, except for the graphs, are not to scale.

DETAILED DESCRIPTION

Figure 1:
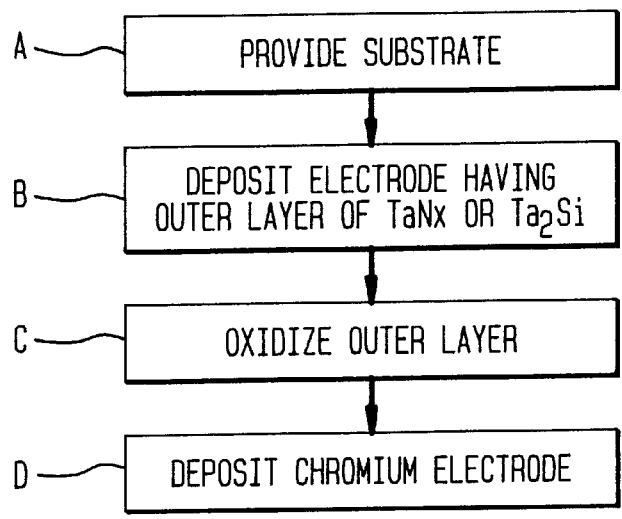
FIG. 1 is a flow diagram showing the steps in making a thin film capacitor in accordance with the invention.

Referring to the drawings, FIG. 1 is a flow diagram showing the steps of a preferred method for making a thin film capacitor in accordance with the invention. The first step, shown as block A of FIG. 1, is to provide a substrate onto which the films of the capacitor can be assembled. The preferred substrate is a conventional monocrystalline silicon substrate having a silicon oxide outer surface. Typically the silicon oxide has a thickness in the range 0.1 to 1 micrometer. Alternatively the substrate can be an insulating ceramic such as alumina.

The next step shown as block B is to form the bottom electrode of the capacitor on the substrate. To make capacitors for low frequency applications (<10⁶ Hz), the electrode can comprise a layer of $TaN_x$ or $Ta_2Si$ deposited, for example, by magnetron reactive sputtering. Typical deposition parameters for $TaN_x$ are 4 KW of power and gas flows of 20 cc Ar and 2–10 cc $N_2$. The nitrogen concentration of the $TaN_x$ film can be in the range between 8 to 33 at. % by varying the $N_2$/Ar flow rate ratio during the deposition. $Ta_2Si$ can be deposited under similar conditions omitting the $N_2$. Typical thicknesses are in the range 0.4–0.6 micrometer. For high frequency applications (>10⁶ Hz), the bottom electrode is preferably a composite layer composed of a thin layer of aluminum with a thin layer of $TaN_x$ deposited thereon. The aluminum can be conveniently deposited by sputtering. Typical deposition parameters are 10 KW and 20 cc Ar. Typical aluminum thicknesses are in the range 0.25 to 1 micrometer.

The third step (Block C of FIG. 1) is to oxidize a portion of the $TaN_x$ or $Ta_2Si$ to form a dielectric layer. This step can be effected by anodic oxidation. The anodization is preferably performed in 0.01 wt % citric acid solution with a platinum electrode. The anodization voltages are advantageously in the range 100–230 V, with a soak time of about one hour. The anodization rates are in the range 16–20 angstroms per volt. The resulting dielectrics are $Ta_2O_5N_y$ from $TaN_x$ or $TaSi_xO_y$ from $Ta_2Si$. Preferably the N content of $Ta_2O_5N_y$ is at least 20 at. %. Typical dielectric thicknesses are in the range 0.1 to 0.25 micrometer.

The final step (Block D) is to form a counter electrode comprising chromium. A thin layer of chromium is deposited preferably by sputtering. Advantageously for high frequency capacitors, an additional layer of metal such as copper or aluminum is deposited on the chromium to enhance conductivity. The chromium preferably has a thickness in excess of 0.1 micrometers, and the copper or aluminum, which can also be sputtered, has a thickness in the range 0.25 to 1 micrometer. The copper can be deposited on the chromium via an intermediate Cr/Cu gradient layer. The patterning of the layers forming the capacitor is carried out using standard photolithographic methods and wet etching.

Figure 2:
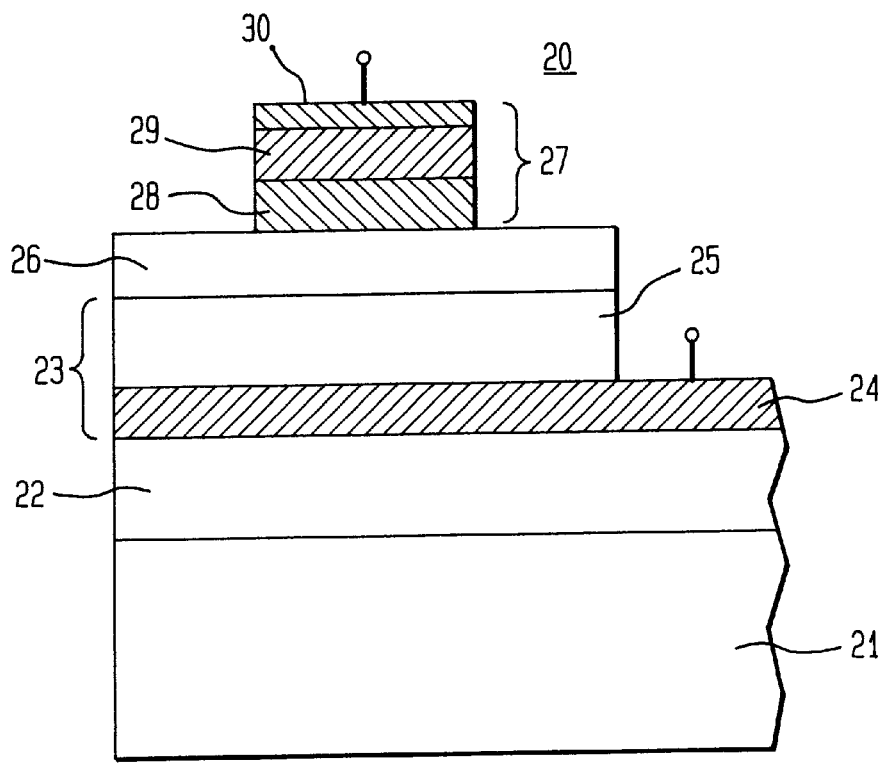
FIG. 2 is a schematic cross section of a first embodiment of a thin film capacitor made by the method of FIG. 1.

A typical resulting structure is schematically shown in FIG. 2 wherein capacitor 20 is formed on a silicon substrate 21 having a thin silicon oxide upper surface 22. The lower electrode 23 (which can be a composite layer of aluminum 24 and $TaN_x$ 25) is disposed on the oxide surface. The $Ta_2O_5N_y$ dielectric 26 is formed on the $TaN_x$, and the counter electrode 27 is preferably a composite film of chromium 28, copper 29, and chromium 30. Exemplary thicknesses are: $SiO_2$, 0.1 to 1 micrometer; Al, 0.25 to 1 micrometer; $Ta_2O_5N_y$, 0.1 to 0.25 micrometer; Cr, >0.1 micrometer; Cu, 0.25 to 1 micrometer; Cr 0.1 micrometer. The outer layer of chromium protects the copper from oxidation.

Figure 3:
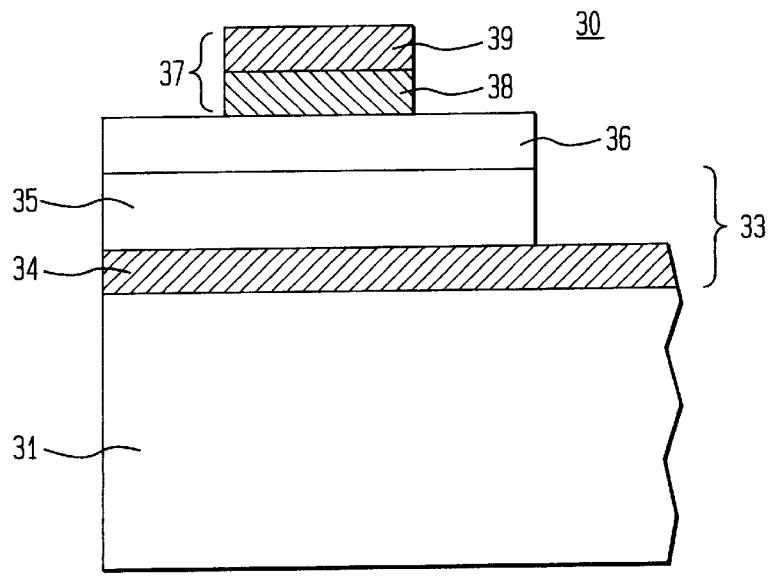
FIG. 3 illustrates an alternative embodiment of a thin film capacitor.

FIG. 3 illustrates an alternative embodiment of a thin film capacitor 30 formed on an alumina substrate 31. The lower electrode 33 is preferably a composite layer of aluminum 34 and $Ta_2Si$ 35, and the dielectric layer 36 is $TaSi_xO_y$ formed on the $Ta_2Si$. For the $TaSi_xO_y$ layer, Si content of about 30 at. % is typical. The counter electrode 37 is preferably a composite film of chromium 38 and aluminum 39. Exemplary thickness are approximately the same as for the FIG. 2 embodiment.

The advantages and applications of the invention can be better understood by consideration of the following specific examples comparing capacitors made using different materials for the dielectric and/or the counter electrode.

EXAMPLE 1

Large area (6 $mm^2$) capacitors were fabricated with reactively sputtered $Ta_2O_5$ films. They exhibited high leakage currents and low breakdown fields.

EXAMPLE 2

Anodized $Ta_2O_5N_y$ and $TaSi_xO_y$ thin film capacitors were fabricated with different electrode materials to evaluate the thermal stability of the capacitors. Al, Cr, $TiN_x$, TiN, and $TaN_x$ were used as counter electrodes. Either Al or Cu were deposited on top of the electrodes to reduce resistance. Capacitors with Al or TiN/Al electrodes degraded after thermal annealing at 350° C. for 1 hr in $N_2$ ambient.

Figure 4:
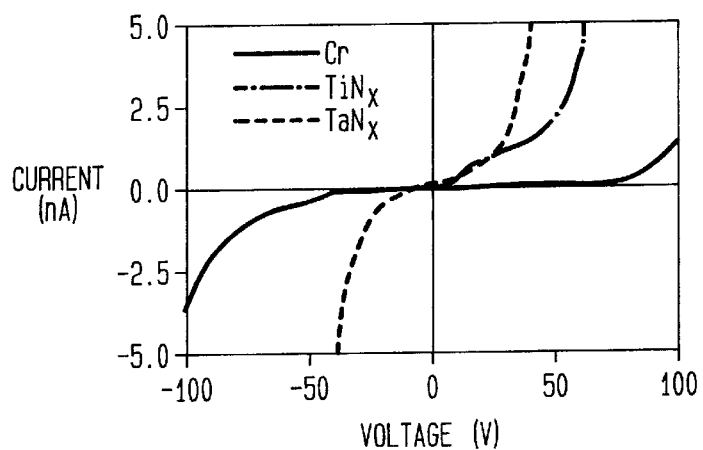
FIG. 4 is a graphical illustration showing the current versus voltage characteristic of thin film $Ta_2O_5N_y$ capacitors using three different electrode structures.

FIG. 4 shows the dc I-V characteristics of large area (6 $mm^2$, 70 $nF/cm^2$) capacitors after a 350° C., 1 hr thermal anneal, with Cr, $TiN_x$, and $TaN_x$ electrodes each with 500 nm Al on top. The dielectric thickness is 240 nm and the nitrogen content of the $TaN_x$ is 33 at %. As seen from FIG. 4, the breakdown fields are different for different electrodes. Cr electrode capacitors showed lowest leakage currents and highest breakdown fields >4 Mv/cm, which are 2 to 3× higher than the values obtained with $TiN_x$ and $TaN_x$. This may be due to the high barrier height of the $Ta_2O_5N_y$/Cr interface. Unannealed capacitors with Cr electrodes have ~5% higher capacitance values compared to those with $TiN_x$ electrodes, indicating an interfacial reaction during $TiN_x$ sputter disposition. The asymmetric conduction (anodic and cathodic polarizations) in the oxide is also small due to nitrogen doping.

Capacitors with $TiN_x$ top electrodes had unacceptable leakage currents and breakdown fields after a second anneal cycle. The leakage current of the capacitors with $TaN_x$ electrodes increased but were acceptable after the second anneal cycle. Capacitors with Cr/Al electrodes degraded after the second anneal cycle, but the capacitors with Cr/Cu/Cr electrodes did not. The breakdown voltage decreased slightly from >100 V to 90 V. This implies that Cr may not be detrimental to the oxide, and the capacitor degradation is likely due to Al diffusion through Cr. This is believed due to the denser Cr films used or the higher N concentration in our oxide.

Figure 5:
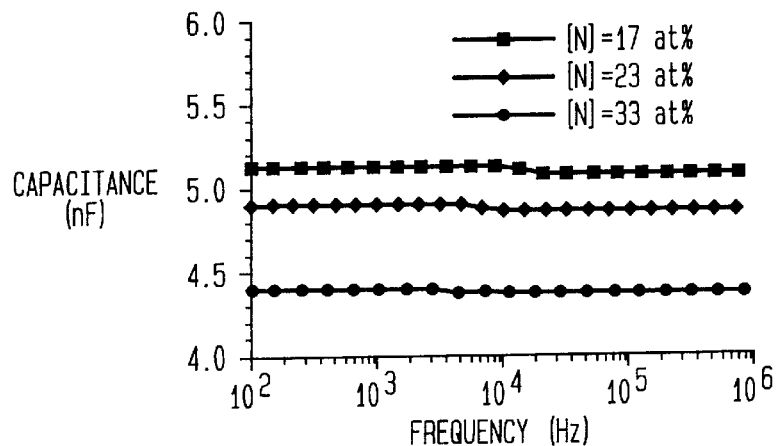
FIG. 5 shows the AC characteristics of $Ta_2O_5N_y$ capacitors with different nitrogen concentrations.

FIG. 5 shows the ac characteristics of the $Ta_2O_5N_y$ capacitors with different nitrogen concentrations and Cr/Al electrodes. These capacitors have an Al underlay to reduce the $TaN_x$ bottom electrode resistance. As seen from the figure, the ac behavior of the capacitors is ideal up to 1 MHz.

The nitrogen concentrations indicated in FIG. 5 are for the $TaN_x$ films. Assuming a 100% incorporation into the oxide during anodization, the reduction in capacitance due to nitrogen doping of $Ta_2O_5$ is linear up to 33 at % nitrogen. The reduction in capacitance is 0.8%/at. % N. The $TaSi_xO_y$ capacitors with Cr/Cu/Cr electrodes are also stable up to three 350° C., 1 hr anneal cycles. The breakdown voltage decreased from >100 V to 50 V after 3 anneal cycles. Thus nitrogen doping or silicon doping improves the leakage current and thermal stability of the capacitors at the expense of a small reduction in capacitance density.

These examples show capacitors with high capacitance density (70 $nF/cm^2$) that are stable up to 3 polyimide curing thermal cycles. These capacitors are useful as integrated passive networks for advanced packaging applications. The Cr, Cu, Al electrode materials are compatible with the packaging industry resulting in economic manufacturing. The capacitors also have low temperature coefficient of capacitance and high linearity.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

What is claimed:

1. A thin film tantalum oxide capacitor comprising:
   a substrate-supported first electrode comprising $TaN_x$, where x denotes the atomic ratio of N;
   a dielectric layer comprising $Ta_2O_5N_y$, where y denotes the atomic ratio of N, having an N content of at least 20 atomic % disposed on said $TaN_x$; and
   a second electrode comprising chromium disposed on said dielectric layer.

2. The capacitor of claim 1 wherein said substrate comprises silicon having a silicon oxide surface.

3. The capacitor of claim 1 wherein said substrate comprises an insulating ceramic material.

4. The capacitor of claim 1 wherein said first electrode is a composite layer comprising aluminum and said $TaN_x$.

5. The capacitor of claim 1 wherein said dielectric layer comprises anodically oxidized $TaN_x$.

6. The capacitor of claim 1 wherein said second electrode is a composite layer comprising chromium and copper, said chromium disposed between said copper and said dielectric.

7. The capacitor of claim 1 wherein said second electrode is a composite layer comprising chromium and aluminum, said chromium disposed between said aluminum and said dielectric.

8. The capacitor of claim 1 wherein said capacitor has an area in excess of 1 mm$^2$.

* * * * *